(12) United States Patent
Kim et al.

(10) Patent No.: US 8,361,682 B2
(45) Date of Patent: Jan. 29, 2013

(54) BLUE COLOR RESIN COMPOSITION FOR COLOR FILTER AND COLOR FILTER USING THE SAME

(75) Inventors: Nam-Gwang Kim, Uiwang-si (KR);
Sang-Won Cho, Uiwang-si (KR);
Tae-Gyu Chun, Uiwang-si (KR);
Noh-Seok Byon, Uiwang-si (KR);
Sun-Hee Jin, Uiwang-si (KR);
Jae-Hyun Kim, Uiwang-si (KR);
Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 218 days.

(21) Appl. No.: 12/972,612

(22) Filed: Dec. 20, 2010

(65) Prior Publication Data

US 2011/0305980 A1   Dec. 15, 2011

(30) Foreign Application Priority Data

Jun. 10, 2010 (KR) .................. 10-2010-0054947

(51) Int. Cl.
*G02B 5/20* (2006.01)
(52) U.S. Cl. .................. 430/7; 430/286.1
(58) Field of Classification Search .................. None
See application file for complete search history.

(56) References Cited

U.S. PATENT DOCUMENTS

| | | | |
|---|---|---|---|
| 5,346,545 A | 9/1994 | Chassot | |
| 5,811,209 A | 9/1998 | Eida et al. | |
| 5,998,091 A | 12/1999 | Suzuki | |
| 6,627,288 B1 | 9/2003 | Ogiso et al. | |
| 2005/0113478 A1 | 5/2005 | Suzuki | |
| 2008/0090478 A1 | 4/2008 | Amou et al. | |
| 2009/0087592 A1* | 4/2009 | Chen et al. ............ | 428/1.31 |
| 2012/0154944 A1* | 6/2012 | Kanna ............ | 359/891 |

FOREIGN PATENT DOCUMENTS

| | | |
|---|---|---|
| EP | 0 725 315 A2 | 8/1996 |
| JP | 06-041458 | 2/1994 |
| JP | 07-140654 | 6/1995 |
| JP | 10-254133 | 9/1998 |
| JP | 2001-221912 | 8/2001 |
| JP | 2002-082347 | 3/2002 |
| JP | 2003-195030 | 7/2003 |
| JP | 2006-079011 | 3/2006 |
| JP | 2010-032999 A * | 2/2010 |
| KR | 10-1996-0011513 | 4/1996 |
| KR | 10-1996-0029904 | 8/1996 |
| KR | 10-2003-0073256 A | 9/2003 |
| KR | 10-0446889 | 8/2004 |
| KR | 10-2005-0041992 A | 5/2005 |
| KR | 10-2006-0001357 A | 1/2006 |
| KR | 10-2008-0031793 A | 4/2008 |
| KR | 10-2010-0058181 A | 6/2010 |
| KR | 10-2010-0078845 | 7/2010 |

OTHER PUBLICATIONS

Computer-generated translation of JP 2010-032999 (Feb. 2010).*

* cited by examiner

*Primary Examiner* — John A. McPherson
(74) *Attorney, Agent, or Firm* — Summa, Additon & Ashe, P.A.

(57) ABSTRACT

Disclosed is a blue resin composition for a color filter that includes a colorant including an azaporphyrin-based dye and a blue pigment, an acrylic-based binder resin, a reactive unsaturated compound, a polymerization initiator, and a solvent.

15 Claims, No Drawings

BLUE COLOR RESIN COMPOSITION FOR COLOR FILTER AND COLOR FILTER USING THE SAME

CROSS-REFERENCE TO RELATED APPLICATION

This application claims priority to and the benefit of Korean Patent Application No. 10-2010-0054947 filed in the Korean Intellectual Property Office on Jun. 10, 2010, the entire disclosure of which is incorporated herein by reference.

FIELD OF THE INVENTION

The present invention relates to a blue resin composition for a color filter and a color filter using the same.

BACKGROUND OF THE INVENTION

Color filters are used for liquid crystal displays (LCD), optical filters for cameras, and the like. Color filters may be fabricated by coating a fine region with three or more colors on a charge-coupled device or a transparent substrate. Methods for making a colored thin film include dyeing, printing, electrophoretic deposition (EPD), pigment dispersion, inkjet printing, and the like. Currently, such methods are used in the manufacture of LCDs for mobile phones, laptops, monitors, TVs, and the like.

The dyeing method forms a colored film by forming an image on a glass substrate with a dyeing agent and then dyeing the image with direct dyes. Examples of dyeing agents used in fabricating colored thin films include natural photosensitive resins such as gelatin, amine-modified polyvinyl alcohols, amine-modified acrylic-based resins, and the like. However, the dyeing process may be complex and lengthy, since it should include resist-printing whenever a color needs to be changed to form a multicolored thin film on the same substrate. In addition, many generally-used dyes and resins may have good color vividness and dispersion but also poor color fastness, water resistance, and heat resistance, which are very important characteristics.

The printing method forms a colored thin film by printing an ink prepared by dispersing a pigment into a thermally curable or photocurable resin and curing it with heat or light. This method may decrease material costs compared with other methods, but it is difficult to form a fine and precise image and to acquire a uniform thin film layer. Korean Patent Laid-Open Publication No. 1996-0011513 discloses formation of a color filter in an inkjet method. However, the resultant color filter suffers similar problems to a color filter made in the dyeing method, for example, deteriorated durability and heat resistance, because a dye-type color resist composition that is dispersed from a nozzle is also used to accomplish fine and precise color printing.

Korean Patent Laid-Open Publication No. 1996-0029904 discloses formation of a color Merin an electrophoretic deposition (EPD) method using an electrical precipitation method. The electrophoretic deposition (EPD) method may accomplish a precisely-colored thin film having excellent heat resistance and color fastness, since it uses a pigment. However, this method may not be applicable for a very precise color filter requiring a finer electrode pattern for a more precise pixel in the future, because a colored thin film may be stained or thicker at both ends due to electrical resistance.

The pigment dispersion method forms a colored film by repeating a series of processes such as coating, patternwise-exposing to light, removing non-exposed part using a solvent, and heat-curing a photopolymer composition including a coloring agent on a transparent substrate including a black matrix. This method can improve heat resistance and durability, which are very important characteristics for a color filter, and can provide a uniformly-thick film.

In this pigment dispersion method, a photosensitive resin composition for a color filter generally includes a binder resin, a photopolymerization monomer, a photopolymerization initiator, a pigment, a solvent, and other additives.

SUMMARY OF THE INVENTION

One embodiment of the present invention provides a blue resin composition for a color filter that can have excellent dissolubility in an organic solvent, a high contrast ratio, and excellent heat resistance, light resistance, and chemical resistance.

Another embodiment of the present invention provides a color filter prepared using the blue resin composition for a color filter.

According to one embodiment of the present invention, a blue resin composition for a color filter is provided, which includes: a colorant including an azaporphyrin-based dye represented by the following Chemical Formula 1, and a blue pigment; an acrylic-based binder resin; a reactive unsaturated compound; a polymerization initiator; and a solvent.

[Chemical Formula 1]

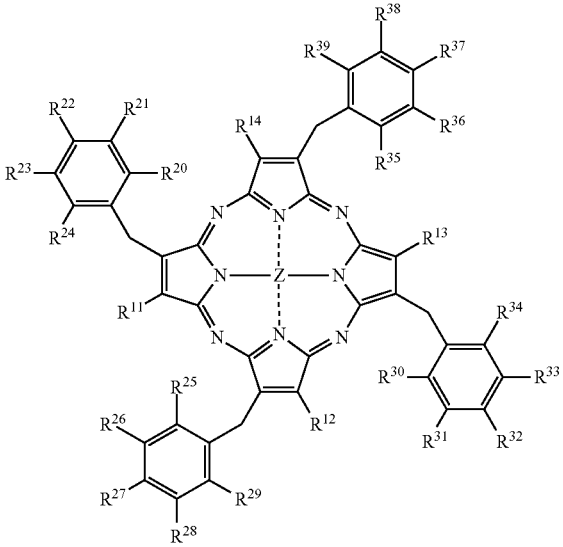

In Chemical Formula 1, $R^{11}$ to $R^{14}$ and $R^{20}$ to $R^{39}$ independently comprise hydrogen, halogen, hydroxy, sulfonic acid (—$SO_3H$), nitro, carboxyl, cyano, substituted or unsubstituted alkyl, substituted or unsubstituted cycloalkyl, substituted or unsubstituted aryl, substituted or unsubstituted heteroalkyl, substituted or unsubstituted heterocycloalkyl, substituted or unsubstituted heteroaryl, or a combination thereof, wherein at least one hydrogen of $R^{11}$ to $R^{14}$ and $R^{20}$ to $R^{39}$ is optionally substituted with —$SO_3^-$ or —$SO_3M$, wherein M is sodium or potassium, and Z comprises two hydrogens, a divalent metal atom, a divalent metal oxide, a divalent metal hydroxide, or a divalent metal chloride.

The blue resin composition for a color filter may include the azaporphyrin-based dye in an amount of 5 parts by weight to 50 parts by weight based on 100 parts of the total weight of the blue pigment.

The blue pigment may be a copper phthalocyanine-based blue pigment.

The blue resin composition for a color filter may further include an auxiliary pigment such as but not limited to a C.I. purple pigment 1, a C.I. purple pigment 19, a C.I. purple pigment 23, a C.I. purple pigment 29, a C.I. purple pigment 32, a C.I. purple pigment 36, a C.I. purple pigment 38, or a combination thereof.

The reactive unsaturated compound may include a thermally-polymerizable monomer or oligomer, a photopolymerizable monomer or oligomer, or a combination thereof.

The polymerization initiator may include a thermal polymerization initiator, a photopolymerization initiator, or a combination thereof.

The blue resin composition for a color filter may include: 0.01 wt % to 20 wt % of the colorant including the azaporphyrin-based dye and the blue pigment; 1 wt % to 20 wt % of the acrylic-based binder resin; 1 wt % to 15 wt % of the reactive unsaturated compound; 0.1 wt % to 10 wt % of the polymerization initiator; and a balance of the solvent.

The blue resin composition for a color filter may further include a surfactant.

According to another embodiment of the present invention, a color filter prepared using the blue resin composition for a color filter is provided.

Further embodiments of the present invention are described in the detailed description.

The blue resin composition for a color filter can have excellent dissolubility in an organic solvent, a high contrast ratio, and excellent heat resistance, light resistance, and chemical resistance.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "substituted" refers to one substituted with one or more substituents including halogen (F, Br, Cl, or I), hydroxy, nitro, cyano, amino (—NRR', wherein R and R' are independently C1 to C10 alkyl), amidino, hydrazine, hydrazone, carboxyl, substituted or unsubstituted alkyl, substituted or unsubstituted aryl, substituted or unsubstituted cycloalkyl, substituted or unsubstituted heteroalkyl, substituted or unsubstituted heteroaryl, substituted or unsubstituted heterocycloalkyl, or a combination thereof, instead of hydrogen in a functional group, one substituted with one or more substituents including =O, =S, =NR (wherein R is C1 to C10 alkyl), =PR (wherein R is C1 to C10 alkyl), =CRR' (wherein R and R' are independently C1 to C10 alkyl), or a combination thereof, instead of two hydrogens, and one substituted with one or more substituents including ≡N, ≡P, and ≡CR (wherein R is C1 to C10 alkyl) or a combination thereof instead of three hydrogens.

As used herein, when a definition is not otherwise provided, the term "alkyl" refers to C1 to C30 alkyl, the term "cycloalkyl" refers to C3 to C30 cycloalkyl, the term "aryl" refers to C6 to C30 aryl, the term "heteroalkyl" refers to C1 to C30 heteroalkyl, the term "heterocycloalkyl" refers to C3 to C30 heterocycloalkyl, and the term "heteroaryl" refers to C6 to C30 heteroaryl.

As used herein, when a definition is not otherwise provided, the term "hetero" refers to one including one or more heteroatoms including N, O, S, P, Si, or a combination thereof.

As used herein in this specification, the term "combination" refers to mixing or copolymerization, unless otherwise defined.

In order to provide better color characteristics such as contrast ratio and the like as compared to current color filters, there is need for a method that can compensate for contrast ratio deterioration due to particle properties of a dispersed pigment. To this end, there is a need for a highly-durable dye with no particle properties in solution or with a primary particle size of less than several nanometers. Accordingly, much research has focused on different kinds of dyes for use in the production of a color filter. However, it is still difficult to provide a color filter that has both excellent photo-transmissivity and absorptivity in a desired color region. In addition, there are few dyes having the reliability required for a color filter and a high contrast ratio.

The blue resin composition for a color filter according to one embodiment of the present invention includes: (A) a colorant including (A-1) an azaporphyrin-based dye represented by the following Chemical Formula 1, and (A-2) a blue pigment; (B) an acrylic-based binder resin; (C) a reactive unsaturated compound; (D) a polymerization initiator; and (E) a solvent.

The azaporphyrin-based dye can have excellent blue photo-transmissivity, and thus it may be used as a colorant for a blue color filter with a high contrast ratio. The azaporphyrin-based dye may have an appropriate spectral characteristic under a color coordinate condition described in sRGB (standard red green blue), NTSC (National Television System Committee), and EBU (European Broadcasting Union) and simultaneously have a high contrast ratio in the color coordinates.

The blue resin composition may further include (F) one or more other additives such as a surfactant and the like.

Hereinafter, each component of the blue resin composition for a color filter according to one embodiment is described.

(A) Colorant (A-1) Azaporphyrin-Based Dye

The blue resin composition for a color filter includes an azaporphyrin-based dye represented by the following Chemical Formula 1.

[Chemical Formula 1]

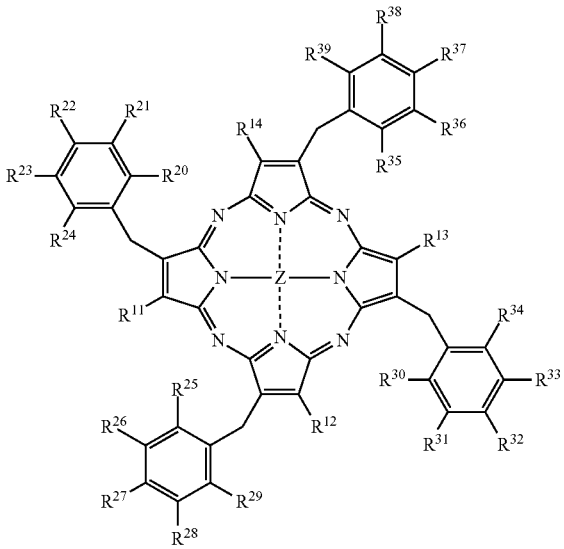

In Chemical Formula 1, $R^{11}$ to $R^{14}$ and $R^{20}$ to $R^{39}$ each independently include hydrogen, halogen, hydroxy, sulfonic acid (—$SO_3H$), nitro, carboxyl, cyano, substituted or unsubstituted alkyl, substituted or unsubstituted cycloalkyl, substituted or unsubstituted aryl, substituted or unsubstituted heteroalkyl, substituted or unsubstituted heterocycloalkyl, substituted or unsubstituted heteroaryl, or a combination thereof, wherein at least one hydrogen of $R^{11}$ to $R^{14}$ and $R^{20}$ to $R^{39}$ is optionally substituted with —$SO_3^-$ or —$SO_3M$, wherein M is sodium or potassium, and Z comprises two hydrogens, a divalent metal atom, a divalent metal oxide, a divalent metal hydroxide, or a divalent metal chloride.

Examples of Z include without limitation VO, TiO, Zn, Mg, Si, Sn, Rh, Pt, Pd, Mo, Mn, Pb, Cu, Ni, Co, Fe, AlCl, InCl, FeCl, $TiCl_2$, $SnCl_2$, $SiCl_2$, $GeCl_2$, Si $(OH)_2$, $H_2$, and the like. In exemplary embodiments, Z can be Cu. The blue resin composition for a color filter may include the azaporphyrin-based dye in an amount of 5 parts by weight to 50 parts by weight, for example 20 to 40 parts by weight, based on 100 parts of the entire weight of a blue pigment. In some embodiments, the blue resin composition for a color filter may include the azaporphyrin-based dye in an amount of 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of the azaporphyrin-based dye can be in a range from any of the foregoing amounts to any other of the foregoing amounts.

When the blue resin composition for a color filter includes the azaporphyrin-based dye in an amount within this range, it may be well-dissolved in a solvent and can have a high contrast ratio and excellent heat resistance, light resistance, and chemical resistance.

(A-2) Blue Pigment

The blue pigment may include any generally-used blue pigment known in the art, such as but not limited to a copper phthalocyanine-based blue pigment.

The copper phthalocyanine-based blue pigment may include a compound classified as a blue pigment according to a color index, such as that published by The Society of Dyers and Colourists. Exemplary blue pigments may include without limitation a C.I. blue pigment (Color Index Pigment Blue) 15, 15:3, 15:4, 15:6, 60, and the like, and combinations thereof.

The blue pigment may be additionally mixed with an auxiliary pigment, which can secure the color characteristics thereof. Examples of the auxiliary pigment may include without limitation a C.I. purple pigment (Color Index Pigment Violet) 1, 19, 23, 29, 32, 36, 38, and the like, and combinations thereof.

The blue pigment may be directly included in the blue resin composition for a color filter as a pigment itself, or as a pigment dispersion composition including a pigment, a dispersing agent, a solvent, and a resin.

Examples of dispersing agents useful in the pigment dispersion composition include without limitation non-ionic dispersing agents, anionic dispersing agents, cationic dispersing agents, and the like. Examples of the dispersing agent include without limitation polyalkylene glycol and esters thereof; polyoxyalkylene; polyhydric alcohol ester alkylene oxide additives; alcohol alkylene oxide additives; alkylamines; and the like. Theses dispersing agents may be used singularly or in combination. The dispersion composition may include the dispersing agent in an amount of 10 parts by weight to 20 parts by weight based on 100 parts by weight of the pigment dispersion composition.

Examples of solvents useful in the pigment dispersion composition include without limitation ethylene glycol acetate, ethyl cellosolve, propylene glycol methyletheracetate, ethyllactate, polyethylene glycol, cyclohexanone, propylene glycol methylether, and the like, and combinations thereof.

In addition, a carboxyl-containing acrylic-based resin as well as the dispersing agent may be added to the pigment in order to improve stability of a pigment dispersion composition and pixel pattern.

The pigment can have a primary particle diameter ranging from 10 to 70 nm. When the pigment has a primary particle diameter within the above range, a pigment dispersion composition thereof may have excellent stability and may not deteriorate pixel resolution.

There is no particular limit with regard to the secondary particle diameter of the pigment. In exemplary embodiments, the pigment may have a secondary particle diameter of less than 200 nm, taking into consideration pixel resolution. In another embodiment, the pigment may have a secondary particle diameter ranging from 70 to 100 nm.

The blue resin composition for a color filter may include the colorant including the azaporphyrin-based dye and the blue pigment in an amount of 0.01 wt % to 20 wt %, for example 0.05 wt % to 10 wt %, based on the entire weight of the blue resin composition for a color filter. In some embodiments, the blue resin composition for a color filter may include the colorant including the azaporphyrin-based dye and the blue pigment in an amount of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19 or 20 wt %. Further, according to some embodiments of the present invention, the amount of the colorant including the azaporphyrin-based dye and the blue pigment can be in a range from any of the foregoing amounts to any other of the foregoing amounts.

When the blue resin composition for a color filter includes the colorant including the azaporphyrin-based dye and the blue pigment in an amount within this range, the composition may provide excellent color reproducibility, pattern shaping, curing, and close attachment (adhesion) characteristics.

(B) Acrylic-Based Binder Resin

The acrylic-based binder resin may include a copolymer of a first ethylenic unsaturated monomer and a second ethylenic unsaturated monomer that is copolymerizable with the first ethylenic unsaturated monomer, and includes at least one acrylic-based repeating unit.

The first ethylenic unsaturated monomer is an ethylenic unsaturated monomer including more than one carboxyl group. Exemplary first ethylenic unsaturated monomers include, but are not limited to, acrylic acid, methacrylic acid, maleic acid, itaconic acid, fumaric acid, and the like, and combinations thereof.

The acrylic-based binder resin may include the first ethylenic unsaturated monomer in an amount of 10 to 40 wt %, for example 20 to 30 wt %, based on the total weight of the acrylic-based binder resin. In some embodiments, the acrylic-based binder resin may include the first ethylenic unsaturated monomer in an amount of 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the first ethylenic unsaturated monomer can be in a range from any of the foregoing amounts to any other of the foregoing amounts.

Examples of the second ethylenic unsaturated monomer include, but are not limited to, alkenyl aromatic monomers, unsaturated carboxylic acid ester compounds, unsaturated carboxylic acid amino alkyl ester compounds, carboxylic acid vinyl ester compounds, unsaturated carboxylic acid glycidyl ester compounds, vinyl cyanide compounds, unsaturated amide compounds, and the like, and combinations thereof.

Examples of the alkenyl aromatic monomer may include without limitation styrene, α-methyl styrene, vinyl toluene, vinyl benzylmethylether, and the like, and combinations thereof. Examples of the unsaturated carboxylic acid ester-based compound may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like, and combinations thereof. Examples of the unsaturated carboxylic acid amino alkyl ester-based compound may include without limitation 2-amino ethyl acrylate, 2-amino ethyl methacrylate, 2-dimethyl amino ethyl acrylate, 2-dimethyl amino ethyl methacrylate, and the like, and combinations thereof. Examples of the carboxylic acid vinyl ester-based compound may include without limitation vinyl acetate, vinyl benzoate, and the like, and combinations thereof. Examples of the unsaturated carboxylic acid glycidyl ester-based compound may include without limitation glycidyl acrylate, glycidyl methacrylate, and the like, and combinations thereof. Examples of the vinyl cyanide compound may include without limitation acrylonitrile, methacrylonitrile, and the like, and combinations thereof. Examples of the unsaturated amide-based compound may include without limitation acryl amide, methacryl amide, and the like, and combinations thereof. These unsaturated monomers may be used singularly or in a combination or mixture of two or more.

Examples of the acrylic-based binder resin including the first ethylenic unsaturated monomer and the second ethylenic unsaturated monomer may include without limitation a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, a methacrylic acid/benzyl methacrylate/styrene/2-hydroxy ethyl methacrylate copolymer, and the like. The acrylic-based binder resins may be used singularly or in a combination or mixture of two or more.

The acrylic-based binder resin may have a weight average molecular weight ranging from 3000 to 150,000. When the acrylic-based binder resin has a weight average molecular weight within this range, it may improve the close contacting (adhesive) property between the substrates and provide excellent physical and chemical properties and adequate viscosity.

The acrylic-based binder resin included in the blue resin composition for a color filter can be a primary factor affecting the resolution of a pixel. For example, when the acrylic-based binder resin is a methacrylic acid/benzylmethacrylate copolymer, it may remarkably improve resolution of a pixel according to an acid value and a weight average molecular weight. When the methacrylic acid/benzyl methacrylate copolymer is included in a ratio of 25/75 (w/w), it may accomplish high resolution of a pixel having an acid value ranging from about 80 to about 120 mgKOH/g and a weight average molecular weight ranging from about 20,000 to about 40,000.

The blue resin composition for a color filter may include the acrylic-based binder resin in an amount of 1 wt % to 20 wt %, for example 3 wt % to 15 wt %, based on the entire weight of the blue resin composition for a color filter. In some embodiments, the blue resin composition for a color filter may include the acrylic-based binder resin in an amount of 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based binder resin can be in a range from any of the foregoing amounts to any other of the foregoing amounts.

When the acrylic-based binder resin is included in an amount within this range, the resulting composition may exhibit good adherence to a substrate, a uniformly thick layer, and excellent post production color filter properties such as layer strength, heat resistance, chemical resistance, after-image, and the like. In addition, it may have proper cross-linking and thus excellent surface panel flatness.

(C) Reactive Unsaturated Compound

The reactive unsaturated compound may be any generally-used thermal polymerization monomer or oligomer, photo-polymerizable monomer or oligomer, or a combination thereof, known in the art which are used for a conventional color resin composition.

Examples of the polymerizable monomer include without limitation at least one of ethylene glycol di(meth)acrylate, diethylene glycol di(meth)acrylate, triethylene glycol di(meth)acrylate, propylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, pentaerythritol penta(meth)acrylate, pentaerythritol hexa(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, trimethylolpropane tri(meth)acrylate, novolac epoxy (meth)acrylate, a dipentaerythritol penta(meth)acrylate derivative including a carboxyl group, ethylene oxide glycerine trimethylol propane tri(meth)acrylate, propylene oxide glycerine tri(meth)acrylate, and the like, and combinations thereof.

Examples of the polymerizable oligomer include without limitation epoxy(meth)acrylate, urethane(meth)acrylate, a polyester(meth)acrylate oligomer, and the like, and combinations thereof.

The polymerizable monomers may include a monomer or an oligomer including a carboxyl group, since they tend to react with a cyclic ether and thereby improve solvent-resistance. Examples of the monomer or the oligomer including a carboxyl group may include without limitation esters of a hydroxyl group-containing (meth)acrylate and carboxylic polyacid, esters of a hydroxyl group-containing (meth)acrylate and carboxylic polyacid anhydride, and the like, and combinations thereof.

Examples of the hydroxyl group-containing (meth)acrylate include without limitation trimethylol propane di(meth)acrylate, glycerine di(meth)acrylate, pentaerythritol tri(meth)acrylate, dipentaerythritol penta(meth)acrylate, and the like, and combinations thereof.

Examples of the carboxylic polyacid include without limitation aromatic carboxylic polyacids such as phthalic acid, 3,4-dimethylphthalic acid, isophthalic acid, terephthalic acid, pyromellitic acid, trimellitic acid, 1,4,5,8-naphthalene tetracarboxylic acid, 3,3',4,4'-benzophenone tetracarboxylic acid, and the like; aliphatic carboxylic polyacids such as succinic acid, glutaric acid, sebacic acid, 1,2,3,4-butane tetracarboxylic acid, maleic acid, fumaric acid, itaconic acid, and the like; alicyclic carboxylic polyacids such as hexahydrophthalic acid, 3,4-dimethyl tetrahydrophthalic acid, hexahydroisophthalic acid, hexahydroterephthalic acid, 1,2,4-cyclopentane tricarboxylic acid, 1,2,4-cyclohexane tricarboxylic acid, cyclopentane tetracarboxylic acid, 1,2,4,5-cyclohexane, tetracarboxylic acid, and the like; and the like, and combinations thereof.

Examples of the carboxylic polyacid anhydride may include without limitation aromatic carboxylic polyacid anhydrides such as phthalic anhydride, pyromellitic anhydride, trimellitic anhydride, 3,3',4,4'-benzophenone tetracarboxylic acid 2 anhydride, and the like; aliphatic carboxylic polyacid anhydrides such as itaconic anhydride, succinic anhydride, citraconic anhydride, dodecenylsuccinic anhydride, tricarballylic anhydride, maleic anhydride, 1,2,3,4-butanetetracarboxylic acid 2 anhydride, and the like; alicyclic carboxylic polyacid anhydrides such as hexahydrophthalic acid, 3,4-dimethyl tetrahydrophthalic anhydride, 1,2,4-cyclopentane tricarboxylic acid anhydride, 1,2,4-cyclohexane tricarboxylic acid anhydride, cyclopentane tetracarboxylic acid 2 anhydride, 1,2,4,5-cyclohexane tetracarboxylic acid 2 anhydride, himic anhydride, nadic acid anhydride, and the like; carboxylic acid anhydrides including an ester group such as ethylene glycol bistrimellitate acid, glycerine tristrimelliatate anhydride, and the like; and the like, and combinations thereof.

Accordingly, examples of the monomer or oligomer including a carboxyl group may include a phthalic acid ester of trimethylol propane di(meth)acrylate, a succinic acid ester of glycerine di(meth)acrylate, a phthalic acid ester of pentaerythritol tri(meth)acrylate, a succinic acid ester of pentaerythritol triacrylate, a phthalic acid ester of dipentaerythritol penta(meth)acrylate, a succinic acid ester of dipentaerythritol penta(meth)acrylate, and the like, and combinations thereof.

The blue resin composition for a color filter may include the reactive unsaturated compound in an amount of 1 wt % to 15 wt %, for example 3 wt % to 10 wt %, based on the entire weight of the blue resin composition for a color filter. In some embodiments, the blue resin composition for a color filter may include the reactive unsaturated compound in an amount of 1, 2, 3, 4, 5, 6, 7, 8, 9, 10, 11, 12, 13, 14, or 15 wt %. Further, according to some embodiments of the present invention, the amount of the reactive unsaturated compound can be in a range from any of the foregoing amounts to any other of the foregoing amounts.

When the resin composition for a color filter includes the reactive unsaturated compound in an amount within this range, the resulting composition may be sufficiently cured and thus can provide excellent reliability, appropriate viscosity, and excellent stability against aging.

(D) Polymerization Initiator

The polymerization initiator may include a thermal polymerization initiator, a photopolymerization initiator, or a combination thereof.

The thermal polymerization initiator may include an organic peroxide or an azo compound. The following exemplary compounds may be used singularly or as a combination or mixture of two or more.

Examples of the organic peroxide include without limitation isobutyl peroxide, 2,4-dichlorobenzoyl peroxide, α-methylbenzoyl peroxide, diisopropylbenzene hydroperoxide, cumene hydroperoxide, tert-butylhydroperoxide, 1,1,3,3,-tetramethylbutylhydroperoxide, 2,5-dimethyl-2,5-di(tert-butylperoxy)hexane, 1,3-bis(tert-butylperoxyisopropyl)benzene, dicumylperoxide, di-tert-butylperoxide, paramenthane hydroperoxide, tert-butylcumylperoxide, di-tert-hexylperoxide, tert-butylperoxy acetate, 2,4,4-trimethylpentylperoxyphenoxyacetate, t-butylperoxybenzoate, 2,2-di-(tert-butylperoxy)butane, di-tert-methoxybutylperoxy dicarbonate, di-2-ethylhexylperoxy dicarbonate, diisopropylperoxy dicarbonate, and the like, and combinations thereof. Other examples of the organic peroxide can include without limitation diisopropylbenzene hydroperoxide, cumenehydroperoxide, tert-butylhydroperoxide, 1,1,3,3,-tetramethylbutylhydroperoxide, 2,5-dimethyl-2,5-di(tert-butylperoxy)hexane, dicumylperoxide, di-tert-butylperoxide, paramenthane hydroperoxide, tert-butylcumylperoxide, di-tert-hexylperoxide, tert-butylperoxyacetate, t-butylperoxybenzoate, 2,2-di-(tert-butylperoxy)butane, and the like, and combinations thereof. In exemplary embodiments the organic peroxide can include, dicumylperoxide, di-tert-hexylperoxide, tert-butylcumylperoxide, di-tert-butylperoxide, paramenthane hydroperoxide, diisopropylbenzene hydroperoxide, 1,1,3,3-tetramethylbutyl hydroperoxide, cumene hydroperoxide, or a combination thereof.

Examples of the azo compound include without limitation 1,1'-azobiscyclohexane-1-carbonitrile, 2,2'-azobis-(2,4-dimethylvaleronitrile), 2,2'-azobis-(4-methoxy-2,4-dimethylvaleronitrile), 2,2'-azobis-(methylisobutylate), 2,2'-azobis-(isobutyronitrile), 4,4'-azobis-(4-cyanovaleric acid), and the like, and combinations thereof.

The photopolymerization initiator may be any generally-used photopolymerization initiator for a photosensitive resin composition as known in the art. Examples thereof include without limitation triazine-based compounds, acetophenone-based compounds, biimidazole-based compounds, active radical generators, acid generators, and the like, and combinations thereof.

Examples of the triazine-based compound include without limitation 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, 2,4-bis(trichloromethyl)-6-piperonyl)-1,3,5-triazine, 2,4,6-trichloro-s-triazine, 2-phenyl-4,6-bis(trichloro methyl)-s-triazine, 2-(3',4'-dimethoxystyryl)-4,6-bis(trichloro methyl)-s-triazine, 2-(4'-methoxynaphthyl)-4,6-bis(trichloro methyl)-s-triazine, 2-(p-methoxyphenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphtho 1-yl)-4,6-bis(trichloro methyl)-s-triazine, 2-(4-methoxy naphtho 1-yl)-4,6-bis(trichloro methyl)-s-triazine, 2-4-trichloro methyl (piperonyl)-6-triazine, 2-4-trichloro methyl(4'-methoxy styryl)-6-triazine, and the like, and combinations thereof. In exemplary embodiments, the triazine-based compound may include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-piperonyl-1,3,5-triazine, or a combination thereof. In another embodiment, 2,4-bis(trichloromethyl)-6-piperonyl-1,3,5-triazine may be used.

Examples of the acetophenone-based compound may include without limitation diethoxyacetophenone, 2-methyl-2-morpholino-1-(4-methylthiophenyl)propan-1-one, 2-hydroxy-2-methyl-1-phenylpropan-1-one, benzyldimethylketal, 2-hydroxy-2-methyl-1-[4-(2-hydroxyethoxy)phenyl]propan-1-one, 1-hydroxycyclohexylphenylketone, 2-benzyl-2-dimethylamino-1-(4-morpholinophenyl)butan-1-one, 2-(4-methylbenzyl)-2-dimethylamino-1-(4-morpholinophenyl)butan-1-one, 2-hydroxy-2-methyl-1-[4-(1-methylvinyl)phenyl]propan-1-one, and the like, and combinations thereof. In exemplary embodiments, the acetophenone-based compound may include 2-methyl-2-morpholino-1-(4-methylthiophenyl)propan-1-one, 2-benzyl-2-dimethylamino-1-(4-morpholinophenyl)butan-1-one, 2-(4-methylbenzyl)-2-dimethyl amino-1-(4-morpholinophenyl)butan-1-one, or a combination thereof. In other exemplary embodiments, the acetophenone-based compound may include 2-benzyl-2-dimethylamino-1-(4-morpholinophenyl)butan-1-one, 2-(4-methylbenzyl)-2-dimethylamino-1-(4-morpholinophenyl)butan-1-one, or a combination thereof.

Examples of the biimidazole-based compound may include without limitation 2,2'-bis(2-chlorophenyl)-4,4',5,5'-tetraphenylbiimidazole, 2,2'-bis(2-chlorophenyl)-4,4',5,5'-tetra(4-carboethoxyphenyl)biimidazole, 2,2',-bis (2-chlorophenyl)-4,4',5,5'-tetra(4-bromophenyl)biimidazole, 2,2'-bis(2-chlorophenyl)-4,4',5,5'-tetra(2,4-dichlorophenyl)biimidazole, 2,2'-bis(2-bromophenyl)-4,4',5,5'-tetraphenylbiimidazole, 2,2'-bis(2,4-dichlorophenyl)-4,4',5,5'-tetraphenylbiimidazole, 2,2'-bis(2-chlorophenyl)-4,4',5,5'-tetra(m-methoxyphenyl)biimidazole, 2,2'-bis(2,3-dichlorophenyl)-4,4',5,5'-tetraphenylbiimidazole, 2,2'-bis(2,6-dichlorophenyl)-4,4',5,5'-tetraphenylbiimidazole, 2,2'-bis (2-nitrophenyl)-4,4',5,5'-tetraphenylbiimidazole, 2,2'-bis(2-methylphenyl)-4,4',5,5'-tetraphenylbiimidazole, and the like, and combinations thereof. In one embodiment, 2,2'-bis(2-chlorophenyl)-4,4',5,5'-tetraphenylbiimidazole or 2,2'-bis(2,3-dichlorophenyl)-4,4',5,5'-tetraphenylbiimidazole may be used.

The active radical generator generates radicals by radiating light. Examples of the active radical generator include without limitation benzoin-based compounds, benzophenone-based compounds, thioxanthone-based compounds, oxime-based compounds, and the like, and combinations thereof.

Examples of the benzoin-based compound include without limitation benzoin, benzoin methylether, benzoin ethylether, benzoin isopropylether, benzoin isobutylether, and the like, and combinations thereof.

Examples of the benzophenone-based compound may include without limitation benzophenone, benzoyl benzoic acid, o-benzoyl benzoic acid methyl, 4-phenyl benzophenone, hydroxy benzophenone, acrylated benzophenone, 3,3'-dimethyl-2-methoxy benzophenone, 4,4'-dichloro benzophenone, 4,4'-bis(dimethylamino)benzophenone, 4,4'-bis(diethylamino)benzophenone, 4-benzoyl-4'-methyldiphenyl sulfide, 3,3',4,4'-tetra(tert-butylperoxycarbonyl)benzophenone, 2,4,6-trimethylbenzophenone, and the like, and combinations thereof.

Examples of the thioxanthone-based compound may include without limitation thioxanthone, 2-methyl thioxanthone, 2-isopropyl thioxanthone, 4-isopropyl thioxanthone, 2,4-diethyl thioxanthone, 2,4-diisopropyl thioxanthone, 2-chloro thioxanthone, 1-chloro-4-propoxythioxanone, and the like, and combinations thereof.

Examples of the oxime-based compound may include without limitation o-acyloxime-based compounds, 2-(o-benzoyloxime)-1-[4-(phenylthio)phenyl]-1,2-octadione, 1-(o-acetyloxime)-1-[9-ethyl-6-(2-methylbenzoyl)-9H-carbazol-3-yl]ethanone, o-ethoxycarbonyl-α-oxyamino-1-phenylpropan-1-one, and the like, and combinations thereof. Examples of the o-acyloxime-based compound include without limitation 1-(4-phenylsulfanylphenyl)-butane-1,2-dion2-oxime-o-benzoate, 1-(4-phenylsulfanylphenyl)-octane-1,2-dion-2-oxime-o-benzoate, 1-(4-phenylsulfanylphenyl)-octane-1-oneoxime-o-acetate, 1-(4-phenylsulfanylphenyl)-butan-1-oneoxime-o-acetate, and the like, and combinations thereof.

Other active radical generators in addition to the above examples may include without limitation 2,4,6-trimethylbenzoyl phenylphosphine oxide, 10-butyl-2-chloroacridone, 2-ethylanthraquinone, benzyl, 9,10-phenanthrene quinone, camphor quinone, phenyl methyl glyoxylate, titanocene compounds, and the like, and combinations thereof.

Other examples of the polymerization initiator in addition to the foregoing include without limitation carbazole-based compounds, diketone-based compounds, sulfonium borate-based compounds, diazo-based compounds, and the like, and combinations thereof. In addition, since the polymerization initiator absorbs light and is excited and then transmits energy, it may be used with a photo-sensitizer causing a chemical reaction.

The blue resin composition for a color filter may include the polymerization initiator in an amount of 0.1 wt % to 10 wt % based on the entire weight of the blue resin composition for a color filter. In some embodiments, the blue resin composition for a color filter may include the polymerization initiator in an amount of 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the polymerization initiator can be in a range from any of the foregoing amounts to any other of the foregoing amounts.

When the polymerization initiator is included in an amount within this range, it may provide sufficient polymerization in the patterning process, without deteriorating transmittance due to non-reacting initiator remnants.

(E) Solvent

The solvent should be compatible with the acrylic-based binder resin and other component materials but does not react therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; and ketone acid esters such as ethyl pyruvate, and the like, and combinations thereof. In addition, the solvent can include a solvent with a high boiling point such as N-methyl formamide, N,N-dimethyl formamide, N-methyl formanilide, N-methyl acetamide, N,N-dimethyl acetamide, N-methylpyrrolidone, dimethyl sulfoxide, benzylethylether, dihexylether, acetylacetone, isophorone, caproic acid, caprylic acid, 1-octanol, 1-nonanol, benzyl alcohol, benzyl acetate, ethyl benzoate, diethyl oxalate, diethyl malate, y-butyrolactone, ethylene carbonate, propylene carbonate, phenyl cellosolve acetate, and the like, and combinations thereof.

In exemplary embodiments, the solvent may include a glycol ether compound such as ethylene glycol monoethyl ether and the like; an ethylene glycol-alkylether acetate compound such as ethyl cellosolve acetate and the like; an ester compound such as 2-hydroxy ethyl propionate and the like; a diethylene glycol compound such as diethylene glycol monomethyl ether and the like; a propylene glycol-alkylether acetate compound such as propylene glycol methylether acetate, propylene glycol propylether acetate, and the like, and combinations thereof, based on compatibility, reactivity, and the like.

In exemplary embodiments, the solvent may include cyclohexanone in an amount of about 10 wt % to 50 wt % based on the entire weight of the solvent, taking into account the solubility of a dye. In some embodiments, the blue resin composition for a color filter may include cyclohexanone in an amount of 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of cyclohexanone can be in a range from any of the foregoing amounts to any other of the foregoing amounts.

The solvent may be used as a balance based on the entire weight of the blue resin composition for a color filter after adding other components in order to appropriately adjust solubility and viscosity and provide good physical and optical characteristics to a product.

(F) Other Additive(s)

The blue resin composition for a color filter may further include one or more additives, such as but not limited to coating-improving agents such as a silicon-based agents, fluorine-based agents, and the like, and combinations thereof in order to improve coating and defoaming, adherence-improving (adhesion improving) agents to improve adherence (adhesion) to a substrate, and the like, and combinations thereof.

The coating-improving agent, the adherence-improving agent, and the like may be used in an amount of about 0.01 wt % to 1 wt % based on the entire weight of the blue resin composition. In some embodiments, the blue resin composition for a color filter may include the coating-improving agent and/or the adherence-improving agent in an amount of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1 wt %. Further, according to some embodiments of the present invention, the amount of the coating-improving agent and/or the adherence-improving agent can be in a range from any of the foregoing amounts to any other of the foregoing amounts.

In addition, the composition may further include other additives such as but not limited to an epoxy compound; malonic acid; 3-amino-1,2-propanediol; a silane-based coupling agent including a vinyl group or a (meth)acryloxy group; a leveling agent; a silicon-based surfactant; a fluorine-based surfactant; a radical polymerization initiator, and the like, and combinations thereof. These and other suitable additives can be use to prevent a spot or a stain during the coating and residue due to non-development, and maintain leveling characteristics. These additives may be included in various amounts as known in the art depending on desired properties.

Examples of the epoxy compound may include without limitation a phenol novolac epoxy resin, a tetra methyl nonphenyl epoxy resin, a bisphenol-A epoxy resin, an alicyclic epoxy resin, an ortho-cresol novolac resin, and the like, and combinations thereof. The blue resin composition for a color filter may include the epoxy compound in an amount of about 0.01 wt % to 10 wt % based on the entire weight of the resin composition. In some embodiments, the blue resin composition for a color filter may include the epoxy compound in an amount of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the epoxy compound can be in a range from any of the foregoing amounts to any other of the foregoing amounts.

When the blue resin composition for a color filter includes an epoxy compound in an amount within this range, the composition may exhibit excellent storage and process margins.

Examples of the silane-based coupling agent may include without limitation vinyl trimethoxysilane, vinyl tris(2-methoxyethoxysilane), 3-glycidoxypropyl trimethoxysilane, 2-(3, 4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercapto propyl trimethoxysilane, and the like, and combinations thereof. The blue resin composition for a color filter may include the silane-based coupling agent in an amount of 0.01 wt % to 2 wt % based on the entire amount of the resin composition. In some embodiments, the blue resin composition for a color filter may include the silane-based coupling agent in an amount of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, or 2 wt %. Further, according to some embodiments of the present invention, the amount of the silane-based coupling agent can be in a range from any of the foregoing amounts to any other of the foregoing amounts.

When the blue resin composition for a color filter includes the silane-based coupling agent in an amount within this range, the composition may exhibit excellent adherence, storage stability, and coating.

The silicon-based surfactant may include a surfactant having a siloxane bond and the like. Examples of the silicon-based surfactant include without limitation DC3PA, SH7PA, DC11PA, SH21PA, SH28PA, 29SHPA, and SH30PA made by Toray Silicone Co., Ltd.; SH8400, a polyester-modified silicone oil, made by Toray Silicone Co., Ltd.; KP321, KP322, KP323, KP324, KP326, KP340, GF made by Shin-Etsu Silicone Chemical Industry Co., Ltd.; TSF4445, TSF4446, TSF4452, TSF4460 made by Toshiba Silicones Co., Ltd.; and the like, and combinations thereof.

The fluorine-based surfactant may have a fluorocarbon chain. Examples of the fluorine-based surfactant may include without limitation fluoride FC430, fluoride FC431 made by Sumitomo 3M Ltd.; Magapack F142D, Magafac F171, Magafac F172, Magafac F173, Magafac F177, Magafac F183, Magafac F470, Magafac F475, Magafac R30 made by Dainippon Ink and Chemicals Inc.; Eftop EF301, Eftop EF303, Eftop EF351, Eftop EF352 made by Shin-Akita Kasei K.K; Saffron S381, Saffron S382, Saffron SC101, Saffron SC105 made by Asahi Glass Co., Ltd.; E5844 made by Daikin Fine Chemical Laboratory Co., Ltd.; and the like, and combinations thereof.

The silicon-based surfactant and the fluorine-based surfactant may be used singularly or in a mixture of two or more.

According to another embodiment of the present invention, a color filter is fabricated using a blue resin composition for a color filter according to the embodiment of the present invention.

The blue resin composition for a color filter can be spin-coated to a thickness of 2.0 µm to 3.4 µm on a bare glass substrate and another glass substrate coated with 500 Å to 1500 Å-thick SiNx (a protective layer) in a method such as a spin-coating and the like. After coating, the layer can be patterned for a color filter by exposing the layer to radiation. The exposed (radiated) coating layer can then be treated with an alkali development solution and is thus patterned as the unexposed (non-radiated) region is dissolved. This process can be repeated as many times as the necessary to provide the number of blue pixels and to provide the color filter pattern. Furthermore, the acquired image pattern may be heated again or cured by exposing the same to radiation to further improve crack-resistance, solvent-resistance, and the like.

Hereinafter, the embodiments are illustrated in more detail with reference to examples. However, the following are exemplary embodiments and are not limiting.

Preparation of a Blue Resin Composition for a Color Filter

EXAMPLE 1

A blue resin composition for a color filter is prepared by mixing the components in the following Table 1.

TABLE 1

| | Component | [g] |
|---|---|---|
| (A-1) azaporphyrin-based dye | KISCO, B90401 | 1 |
| (A-2) blue pigment | C.I. blue pigment 15:6 (copper phthalocyanine-based) | 1.5 |
| (A-2') auxiliary pigment | C.I. purple pigment 23 | 0.7 |
| (B) acrylic-based binder resin | Miwon Commercial Co., Ltd., NPR-1520 (methacrylic acid/ benzylmethacrylate copolymer 15/85 (W/W), Mw = 22,000) | 5 |
| (C) reactive unsaturated compound | dipentaerythritol hexaacrylate (DPHA) | 8 |
| (D) polymerization initiator | 1,2-octadione | 1 |
| | 2-dimethylamino-2-(4-methylbenzyl)-1-(4-morpholin-4-yl phenyl)-butan-1-one | 0.5 |
| (E) solvent | propylene glycol monomethyl ether acetate (PGMEA) | 82.3 |

First, 1,2-octadione and 2-dimethylamino-2-(4-methylbenzyl)-1-(4-morpholin-4-yl phenyl)-butan-1-one as a photopolymerization initiator are dissolved in propylene glycol monomethylether acetate (PGMEA) as a solvent. The solution is agitated for 2 hours at room temperature.

Next, NPR-1520, an acrylic-based binder resin, and dipentaerythritol hexaacrylate, a reactive unsaturated compound, are added to the PGMEA solution including the photopolymerization initiator. The resulting mixture is io agitated at room temperature for 2 hours.

Then, C.I. blue pigment 15:6, a copper phthalocyanine-based pigment, C.I. purple pigment 23, an auxiliary pigment, and B90401, an azaporphyrin-based dye, are added to the resulting product and agitated for one hour at room temperature.

EXAMPLE 2 AND COMPARATIVE EXAMPLES 1 AND 2

Each blue resin composition for a color filter according to Example 2 and Comparative Examples 1 and 2 is prepared according to the same method as Example 1 except for changing the composition as set forth in the following Table 2.

TABLE 2

| Component [g] | Example 2 | Comparative Example 1 | Comparative Example 2 |
|---|---|---|---|
| (A-1) azaporphyrin-based dye (KISCO, B90401) | 0.5 | — | — |
| (A-1') cyanine-based dye (St-Jean Photochemicals Co., Ltd, CYD 1006) | 1 | — | 1.5 |
| (A-2) copper phthalocyanine-based pigment (C.I. blue pigment 15:6) | 1.8 | 1.68 | 1.8 |
| (A-2') auxiliary pigment (C.I. purple pigment 23) | — | 0.72 | — |
| (B) acrylic-based binder resin (Miwon Commercial Co., Ltd., NPR-1520) | 4.7 | 5.1 | 4.7 |
| (C) reactive unsaturated compound (DPHA) | 8 | 8 | 8 |
| (D-1) polymerization initiator 1 (1,2-octadione) | 1 | 1 | 1 |
| (D-2) polymerization initiator 2 (2-dimethylamino-2-(4-methylbenzyl)-1-(4-morpholin-4-yl phenyl)-butan-1-one) | 0.5 | 0.5 | 0.5 |
| (E) solvent (PGMEA) | 82.5 | 83 | 82.5 |

Property Evaluation 1: Luminance Measurement

The blue resin compositions for a color filter according to Examples 1 and 2 and Comparative Examples 1 and 2, respectively, are coated to a thickness of 2 µm on a 10 cm×10 cm glass substrate and then pre-baked for 2 minutes on a 90° C. hot plate and cooled to room temperature for 1 minute. The resulting products are exposed to a light in an exposure amount of 100 mJ/cm$^2$, using an exposer. Then, they are post-baked in a 160° C. convection oven for 20 minutes and color characteristics are measured using a spectrophotometer MCPD3000 made by Otsuka electronic Co., Ltd. The color characteristic measurements are provided as x and y. color coordinates (Bx, By) and luminance Y in the following Table 3.

Property Evaluation 2: Contrast Ratio

The blue resin compositions for a color filter of Examples 1 and 2 and Comparative Examples 1 and 2, respectively, are spin-coated to a thickness of 2 µm on a 10 cm×10 cm glass substrate and then pre-baked for 2 minutes on a 90° C. hot plate and cooled to room temperature for 1 minute. The resulting products are exposed to a light in an exposure amount of 100 mJ/cm$^2$ and then the contrast ratio is measured according to the following Equation 1 after measuring each light amount when a polarizer is open and closed using Contrast tester CT-1 made by Tsubosaka Electric Co., Ltd. The contrast ratio results are provided in the following Table 3.

$$\text{Contrast ratio} = L_{open}/L_{close} \quad \text{[Equation 1]}$$

$L_{open}$: light amount when a polarizer is open
$L_{close}$: light amount when a polarizer is closed

TABLE 3

|  | Color coordinate | | Luminance | |
| --- | --- | --- | --- | --- |
|  | x | y | Y | Contrast ratio |
| Example 1 | 0.147 | 0.081 | 8.4 | 10,200 |
| Example 2 | 0.147 |  | 8.8 | 9800 |
| Comparative Example 1 | 0.147 |  | 8.4 | 8800 |
| Comparative Example 2 | 0.147 |  | 8.8 | 8000 |

Referring to Table 3, the blue resin composition for a color filter of Examples 1 and 2 has a better contrast ratio than the one of Comparative Examples 1 and 2.

Property Evaluation 3: Reliability Measurement

The blue resin compositions for a color filter according to Examples 1 and 2 and Comparative Examples 1 and 2, respectively, are spin-coated to a thickness of 2 μm on a 10 cm×10 cm glass substrate and then pre-baked on a 90° C. hot plate for 2 minutes and cooled to room temperature for one minute. The resulting products are exposed to a light in a light amount of 100 mJ/cm² (reference: 365 nm). Then, they are post-baked in a 160° C. convection oven for 20 minutes and color characteristics are measured using a spectrophotometer, MCPD3000 made by Otsuka electronic Co., Ltd. Next, each specimen is treated under the conditions of heating, dipping in a chemical material, and photo-radiating, and color characteristics are measured again. Then, their ΔEab* values are calculated based on the acquired spectral characteristic results, and are provided in the following Table 4. When the ΔEab* is smaller than 3, a color filter has satisfactory reliability.

Heat Resistance

The divided color specimen is additionally heat-treated for 30 minutes in a 160° C. convention oven.

Chemical Resistance Measurement

The divided color specimen is dipped in a solvent mixture of methyl 3-methoxypropionate (MMP)/ethylene glycol dimethylether (EDM) mixed in a volume ratio of 5:5 at room temperature for 30 minutes.

Light Resistance Measurement

The divided color specimen is radiated in a light amount of 1,000,000 lux for 8 hours in a Q-sun Xenon test chamber.

TABLE 4

|  | Heat resistance | Chemical resistance | Light resistance |
| --- | --- | --- | --- |
| Example 1 | 1.1 | 0.3 | 0.4 |
| Example 2 | 1.8 | 0.4 | 0.4 |
| Comparative Example 1 | 1.3 | 0.3 | 0.2 |
| Comparative Example 2 | 1.9 | 0.4 | 0.3 |

Referring to Table 4, the blue resin compositions for a color filter according to Examples 1 and 2 had ΔEab* of less than about 3 and satisfactory reliability based on the heat resistance, chemical resistance, and light resistance measurements.

Therefore, the blue resin composition for a color filter including an azaporphyrin-based dye according to the embodiment of the present invention can have a high contrast ratio and high durability.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A blue resin composition for a color filter, comprising:
   (A) a colorant comprising (A-1) an azaporphyrin-based dye represented by the following Chemical Formula 1, and (A-2) a blue pigment;
   (B) an acrylic-based binder resin;
   (C) a reactive unsaturated compound;
   (D) a polymerization initiator; and
   (E) a solvent:

[Chemical Formula 1]

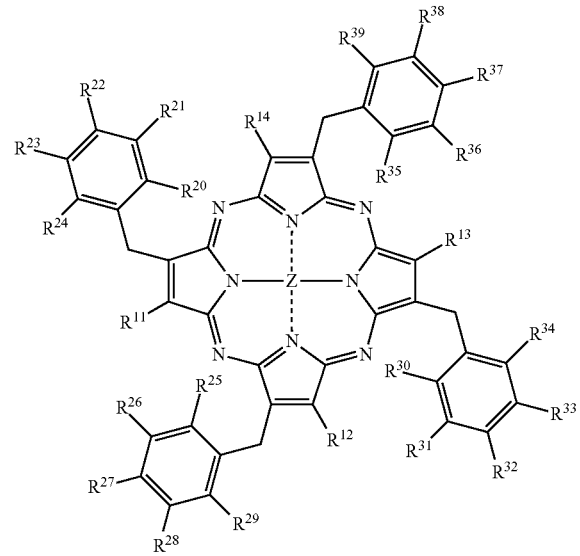

wherein, in Chemical Formula 1, $R^{11}$ to $R^{14}$ and $R^{20}$ to $R^{39}$ independently comprise hydrogen, halogen, hydroxy, sulfonic acid (—SO$_3$H), nitro, carboxyl, cyano, substituted or unsubstituted alkyl, substituted or unsubstituted cycloalkyl, substituted or unsubstituted aryl, substituted or unsubstituted heteroalkyl, substituted or unsubstituted heterocycloalkyl, substituted or unsubstituted heteroaryl, or a combination thereof, wherein at least one hydrogen of $R^{11}$ to $R^{14}$ and $R^{20}$ to $R^{39}$ is optionally substituted with —SO$_3^-$ or —SO$_3$M, wherein M is sodium or potassium, and Z comprises from two hydrogens, a divalent metal atom, a divalent metal oxide, a divalent metal hydroxide, or a divalent metal chloride.

2. The blue resin composition for a color filter of claim 1, comprising the azaporphyrin-based dye in an amount of 5 parts by weight to 50 parts by weight based on 100 parts by weight of the blue pigment.

3. The blue resin composition for a color filter of claim 1, comprising the azaporphyrin-based dye in an amount of 20 parts by weight to 40 parts by weight based on 100 parts by weight of the blue pigment.

4. The blue resin composition for a color filter of claim 1, wherein Z is VO, TiO, Zn, Mg, Si, Sn, Rh, Pt, Pd, Mo, Mn, Pb, Cu, Ni, Co, Fe, AlCl, InCl, FeCl, $TiCl_2$, $SnCl_2$, $SiCl_2$, $GeCl_2$, $Si(OH)_2$, or $H_2$.

5. The blue resin composition for a color filter of claim 4, wherein Z is Cu.

6. The blue resin composition for a color filter of claim 1, wherein the blue pigment is a copper phthalocyanine-based blue pigment.

7. The blue resin composition for a color filter of claim 1, wherein the blue resin composition for a color filter further comprises an auxiliary pigment comprising C.I. purple pigment 1, C.I. purple pigment 19, C.I. purple pigment 23, C.I. purple pigment 29, C.I. purple pigment 32, C.I. purple pigment 36, C.I. purple pigment 38, or a combination thereof.

8. The blue resin composition for a color filter of claim 1, wherein the reactive unsaturated compound comprises a thermally polymerizable monomer, a thermally polymerizable oligomer, a photopolymerizable monomer, a photopolymerizable oligomer, or a combination thereof.

9. The blue resin composition for a color filter of claim 1, wherein the polymerization initiator comprises a thermal polymerization initiator, a photopolymerization initiator, or a combination thereof.

10. The blue resin composition for a color filter of claim 1, wherein the blue resin composition for a color filter comprises:
    0.01 wt % to 20 wt % of the colorant (A) comprising the azaporphyrin-based dye (A-1) and the blue pigment (A-2);
    1 wt % to 20 wt % of the acrylic-based binder resin (B);
    1 wt % to 15 wt % of the reactive unsaturated compound (C);
    0.1 wt % to 10 wt % of the polymerization initiator (D); and
    a balance of the solvent (E).

11. The blue resin composition for a color filter of claim 10, wherein the blue resin composition for a color filter comprises 0.05 wt % to 10 wt % of the colorant (A) comprising the azaporphyrin-based dye (A-1) and the blue pigment (A-2).

12. The blue resin composition for a color filter of claim 10, wherein the acrylic-based binder resin is a copolymer of a first ethylenic unsaturated monomer and a second ethylenic unsaturated monomer that is copolymerizable with the first ethylenic unsaturated monomer and includes at least one acrylic-based repeating unit.

13. The blue resin composition for a color filter of claim 12, wherein the copolymer comprises 10 to 40 wt % of the first ethylenic unsaturated monomer comprising acrylic acid, methacrylic acid, maleic acid, itaconic acid, fumaric acid, or a combination thereof, and the second ethylenic unsaturated monomer comprises an alkenyl aromatic monomer, unsaturated carboxylic acid ester, unsaturated carboxylic acid amino alkyl ester, carboxylic acid vinyl ester, unsaturated carboxylic acid glycidyl ester, vinyl cyanide compound, unsaturated amide, or a combination thereof.

14. The blue resin composition for a color filter of claim 1, wherein the blue resin composition for a color filter further comprises a surfactant.

15. A color filter provided using the blue resin composition for a color filter according to claim 1.

\* \* \* \* \*